United States Patent
Poole et al.

(10) Patent No.: US 10,056,541 B2
(45) Date of Patent: Aug. 21, 2018

(54) METALLIC GLASS MESHES, ACTUATORS, SENSORS, AND METHODS FOR CONSTRUCTING THE SAME

(71) Applicant: Apple Inc., Cupertino, CA (US)

(72) Inventors: Joseph C. Poole, San Francisco, CA (US); Theodore A. Waniuk, Lake Forest, CA (US); Jeffrey L. Mattlin, San Francisco, CA (US); Michael S. Nashner, San Jose, CA (US); Christopher D. Prest, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 367 days.

(21) Appl. No.: 14/690,221

(22) Filed: Apr. 17, 2015

(65) Prior Publication Data

US 2015/0315687 A1   Nov. 5, 2015

Related U.S. Application Data

(60) Provisional application No. 61/986,810, filed on Apr. 30, 2014.

(51) Int. Cl.
  *C22C 45/00*  (2006.01)
  *H01L 41/18*  (2006.01)
  (Continued)

(52) U.S. Cl.
  CPC ............. *H01L 41/18* (2013.01); *B22F 1/00* (2013.01); *B22F 3/1028* (2013.01); *B22F 3/1055* (2013.01); *B22F 3/1103* (2013.01); *C22C 1/002* (2013.01); *C22C 33/003* (2013.01); *C22C 45/00* (2013.01); *C22C 45/02* (2013.01); *G01K 3/04* (2013.01); *G01K 13/00* (2013.01); *H01L 41/12* (2013.01); *H01L 41/20* (2013.01);
  (Continued)

(58) Field of Classification Search
  CPC .......... H01L 41/18; H01L 41/047; B22F 1/00; H03H 9/0595
  USPC ......................... 310/328, 364, 365, 366, 367
  See application file for complete search history.

(56) References Cited

U.S. PATENT DOCUMENTS

| | | | |
|---|---|---|---|
| 4,386,896 A | 6/1983 | Ray | |
| 5,288,344 A | 2/1994 | Peker et al. | |

(Continued)

FOREIGN PATENT DOCUMENTS

| | | |
|---|---|---|
| JP | 2001-303218 | 10/2001 |
| JP | 2009-173964 | 5/2009 |
| JP | 2014-058716 | 4/2014 |

OTHER PUBLICATIONS

Hays et al., "Microstructure Controlled Shear Band Pattern Formation and Enhanced Plasticity of Bulk Metallic Glasses Containing in situ Formed Ductile Phase Dendrite Dispersions," *Physical Review Letters*, Mar. 2000, Vo.. 84, No. 13, pp. 2901-2904.

(Continued)

*Primary Examiner* — Bryan Gordon
(74) *Attorney, Agent, or Firm* — Polsinelli PC

(57) ABSTRACT

Described herein are methods of constructing a part using metallic glass alloys, layer by layer, as well as metallic glass-forming materials designed for use therewith. Metallic glass meshes, metallic glass actuators, three dimensional metallic glass thermal history sensors, and methods of their manufacture are also disclosed.

7 Claims, 9 Drawing Sheets

(51) Int. Cl.

| | |
|---|---|
| *C22C 1/00* | (2006.01) |
| *H01L 41/12* | (2006.01) |
| *G01K 13/00* | (2006.01) |
| *G01K 3/04* | (2006.01) |
| *H01L 41/20* | (2006.01) |
| *H01L 41/33* | (2013.01) |
| *B22F 1/00* | (2006.01) |
| *C22C 33/00* | (2006.01) |
| *C22C 45/02* | (2006.01) |
| *B22F 3/10* | (2006.01) |
| *B22F 3/105* | (2006.01) |
| *B22F 3/11* | (2006.01) |
| *B33Y 80/00* | (2015.01) |

(52) U.S. Cl.
CPC ........... *H01L 41/33* (2013.01); *B22F 2203/11* (2013.01); *B33Y 80/00* (2014.12); *C22C 2200/02* (2013.01); *Y02P 10/295* (2015.11); *Y10T 428/12361* (2015.01)

(56) References Cited

U.S. PATENT DOCUMENTS

| | | | |
|---|---|---|---|
| 5,368,659 A | 11/1994 | Peker et al. | |
| 5,576,884 A * | 11/1996 | Ise | G02B 5/08 359/514 |
| 5,618,359 A | 4/1997 | Lin et al. | |
| 5,647,921 A | 7/1997 | Odagawa et al. | |
| 5,711,363 A | 1/1998 | Scruggs et al. | |
| 5,735,975 A | 4/1998 | Lin et al. | |
| 6,086,651 A | 7/2000 | Mizushima | |
| 6,325,868 B1 | 12/2001 | Kim et al. | |
| 6,749,700 B2 | 6/2004 | Sunakawa et al. | |
| 7,575,040 B2 | 8/2009 | Johnson | |
| 2001/0028245 A1 * | 10/2001 | Li | G01R 33/02 324/312 |
| 2004/0046481 A1 * | 3/2004 | Takeuchi | B41J 2/14233 310/311 |
| 2006/0157164 A1 | 7/2006 | Johnson et al. | |
| 2006/0254386 A1 | 11/2006 | Inoue et al. | |
| 2007/0003782 A1 | 1/2007 | Collier | |
| 2007/0079907 A1 | 4/2007 | Johnson et al. | |
| 2007/0111119 A1 | 5/2007 | Hu et al. | |
| 2007/0267111 A1 * | 11/2007 | Fleury | C22C 1/002 148/561 |
| 2007/0290339 A1 | 12/2007 | Suh et al. | |
| 2008/0118387 A1 | 5/2008 | Demetriou et al. | |
| 2008/0155839 A1 | 7/2008 | Anderson | |
| 2008/0185188 A1 | 8/2008 | Blue et al. | |
| 2008/0209976 A1 | 9/2008 | Deneuville | |
| 2009/0139858 A1 | 6/2009 | Nakamura et al. | |
| 2009/0246549 A1 | 10/2009 | Jang et al. | |
| 2010/0084052 A1 | 4/2010 | Farmer et al. | |
| 2010/0230012 A1 | 9/2010 | Demetriou et al. | |
| 2010/0300148 A1 | 12/2010 | Demetriou et al. | |
| 2010/0310901 A1 * | 12/2010 | Makino | C22C 33/003 428/800 |
| 2011/0025171 A1 * | 2/2011 | Goto | G01N 29/12 310/328 |
| 2011/0165339 A1 | 7/2011 | Skoglund et al. | |
| 2012/0174976 A1 | 7/2012 | Kim et al. | |
| 2012/0247948 A1 | 10/2012 | Shin et al. | |
| 2012/0312061 A1 | 12/2012 | Pham et al. | |
| 2012/0325051 A1 | 12/2012 | Watson | |
| 2013/0139964 A1 | 6/2013 | Hofmann et al. | |
| 2013/0309121 A1 * | 11/2013 | Prest | B22F 3/1055 419/7 |
| 2014/0007983 A1 | 1/2014 | Prest et al. | |
| 2014/0334106 A1 | 11/2014 | Prest et al. | |
| 2015/0202841 A1 | 7/2015 | Verreault et al. | |
| 2015/0267286 A1 | 9/2015 | Na et al. | |
| 2015/0299825 A1 | 10/2015 | Poole et al. | |
| 2015/0314566 A1 | 11/2015 | Poole et al. | |
| 2015/0315678 A1 | 11/2015 | Poole et al. | |
| 2016/0024630 A1 | 1/2016 | Weber et al. | |

OTHER PUBLICATIONS

Conner et al., "Mechanical Properties of Tungsten and Steel Fiber Reinforced $Zr_{41.25}Ti_{13.75}Cu_{12.5}Ni_{10}Be_{22.5}$ Metallic Glass Matrix Composites," *Acta mater.*, 1998, vol. 46, No. 7, pp. 6089-6102.

Kato et al., "Relationship between thermal expansion coefficient and glass transition temperature in metallic glasses," *Scripta Materialia*, 2008, vol. 58, pp. 1106-1109.

Shackelford, James R. Alexander, William CRC Materials Science and Engineering Handbook, (2001), Taylor & Francis, (3rd Edition), Table 112.

Shen et al., "Bulk Glassy $Co_{43}Fe_{20}Ta_{5.5}B_{31.5}$ Alloy with High Glass-Forming Ability and Good Soft Magnetic Properties," *Materials Transactions*, vol. 42, No. 10 (2001) pp. 2136-2139.

Inoue et al., "Bulk Amorphous Alloys with High Mechanical Strength and Good Soft Magnetic Properties in Pe-TM-B (Tm=IV-VII Group Transition Metal) System," *Appl. Phys. Lett.*, vol. 71, (1997) pp. 464.

* cited by examiner

METALLIC GLASS MESHES, ACTUATORS, SENSORS, AND METHODS FOR CONSTRUCTING THE SAME

CROSS-REFERENCE TO RELATED APPLICATION

The present application claims the benefit of U.S. Provisional Patent Application No. 61/986,810, entitled "Methods for Constructing Three-Dimensional Metallic Glass Alloys, and Sensors and Parts Constructed Therefrom," filed on Apr. 30, 2014, which is incorporated herein by reference in its entirety.

FIELD

The disclosure is directed to methods of constructing parts using metallic glass alloys, and metallic glass alloy materials for use therewith.

BACKGROUND

Bulk-solidifying amorphous alloys or bulk metallic glasses ("BMGs") have been made in a variety of metallic systems. They are generally prepared by quenching from above the melting temperature to the ambient temperature. Generally, high cooling rates, such as one on the order of $10^{5\circ}$ C./sec to $10^{3\circ}$ C./sec, are needed to achieve an amorphous structure. The lowest rate by which a metallic glass can be cooled to avoid crystallization, thereby achieving and maintaining the amorphous structure during cooling, is referred to as the critical cooling rate for the metallic glass. In order to achieve a cooling rate higher than the critical cooling rate, heat has to be extracted from the sample. The thickness of articles made from amorphous alloys often becomes a limiting dimension, which is generally referred to as the critical (casting) thickness.

There exists a need for methods of constructing parts using metallic glass, as well as a need for metallic glass-forming materials designed for use in such methods.

SUMMARY

Described herein are metallic glass meshes having average mesh openings and/or acoustic resonance, metallic glass actuators, metallic glass thermal history sensors, and methods of making and using the same. Such compositions and parts can be formed, for example, by layer deposition.

In certain embodiments, parts and or structures are made using metallic glass alloys, constructed layer by layer. In accordance with certain aspects, a layer of metallic glass-forming alloy, including powders, wires (threads), or sheets, is deposited to selected positions and then fused to a layer below by suitable methods such as laser heating or electron beam heating. The deposition and fusing are then repeated as need to construct the part, layer by layer. In various aspects, the metallic glass-forming alloy is an atomized metallic glass-forming powder. In certain aspects, the metallic glass-forming powder is a homogenous atomized metallic glass-forming powder. For instance, an amorphous alloy may be atomized during cooling to form an atomized metallic glass-forming powder, and the atomized metallic glass-forming powder may be mixed to provide a homogenous atomized metallic glass-forming powder.

The methods described herein can be used to make various metallic glass containing devices, including metallic glass mesh, actuators, and thermal history sensors.

In one aspect, a method of manufacturing a metallic glass mesh is provided. A layer of a metallic glass-forming alloy is deposited to form a lattice pattern. In some embodiments, the structure of the lattice can be an organized or ordered patter. In other embodiments, the structure of the lattice can be random and/or lack order. In some embodiments, the metallic glass-forming alloy can be deposited on portions of a housing to integrally form the metallic glass mesh in the housing. The metallic glass-forming alloys heated to a temperature above the melting temperature of the alloy to form a molten alloy. The molten alloy is cooled to form a metallic glass mesh attached to one or more portions of the housing. In other embodiments, when the metallic glass alloy comprises a powder in an amorphous state, the metallic glass-forming alloy can be heated between Tg and Tx of the alloy. In various embodiments, the mesh can be manufactured directly into a device housing.

In one aspect, laser heating or electron beam heating can be used to create high mechanical strength acoustic meshes directly into a housing. Doing so allows design flexibility, such as the capability to hide acoustic openings with blending, or allow an acoustic mesh to be flush with a surface. It also can reduce the assembly burden because no alignment between parts is required and there are fewer assembly steps. Further, the method can result in a higher strength mesh.

In another aspect, the disclosure is directed to a metallic glass actuator. The actuator includes first and third portions comprising a metallic glass, where the third portion has a volume less than the volume of the first metallic glass portion, and a second portion disposed between the first and second metallic portions and comprising a material different then the first and third metallic glass portions. In various embodiments, the second portion can be a different metallic glass, a non-metallic glass material, or a void structure. In various aspects, the void structure comprises at least 5% voids by volume of the metallic glass actuator. The actuator can change volume under the influence of an applied magnetic or electric field. In various aspects, heating (e.g. laser, electron beam, or other suitable means) of a metallic glass-forming alloy powder can be used to create intentional voids in a structure which allows controlled displacement and/or deflection of parts under applied magnetic or electric fields. Such structures can be prepared, for example, by designing a laser heating or electron beam heating method in which less metallic glass powder is added during the heating.

In another aspect, the disclosure is directed to an amorphous metal thermal history sensor. The sensor includes a plurality of metallic glass beams built one upon the other and optionally separated by support spacers (e.g. lugs). Each beam can be manufactured with differing thermal exposure, or is selected to have a crystallization temperature (Tx) in the desired temperature range of tested amorphous alloys. In various embodiments, thermal exposure can be varied during construction of the thermal history sensor such as by altering the scan speed, power of laser, number of passes, and/or line spacing. In various embodiments, properties of the metallic glass beams can be measured to correlate thermal conditions of metallic glass production and properties of the metallic glass beams.

In various aspects, one or more sections or layers of material that is not a metallic glass can be included as needed to form a composite final part. For instance, sections or layers of non-amorphous material, crystalline material, Kevlar fiber, or non-heated metallic glass-forming powder, can be included to form composite parts.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
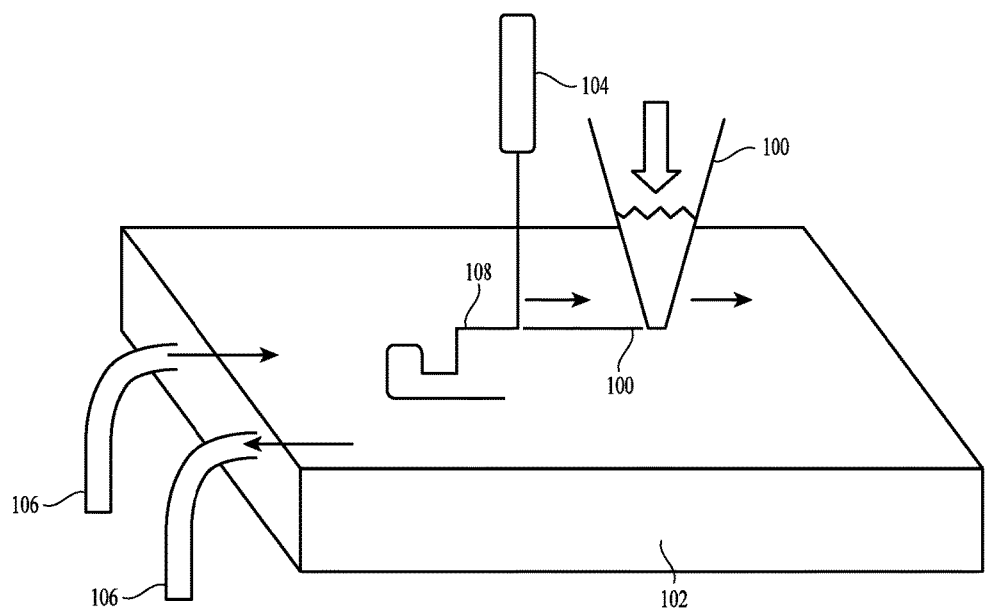
FIG. 1 depicts an exemplary method of constructing a part from metallic glass-forming powder layer by layer.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Metallic glass-forming alloys, bulk-solidifying amorphous alloys, or BMGs are a class of metallic materials. These alloys may be solidified and cooled at relatively slow rates, and they retain the amorphous, non-crystalline (i.e., glassy) state at room temperature. Amorphous alloys (as referred to as metallic glasses) have many superior properties compared to their crystalline counterparts. However, if the cooling rate is not sufficiently high, crystals may form inside the alloy during cooling, so that the benefits of the amorphous state can be lost. For example, one challenge with the fabrication of bulk amorphous alloy parts is partial crystallization of the parts due to either slow cooling or impurities in the raw alloy material. As a high degree of amorphicity (and, conversely, a low degree of crystallinity) is desirable in metallic glass parts, there is a need to develop methods for fabricating metallic glass parts that have a controlled amount of amorphicity.

Metallic glass structures that can be prepared by printing and layer deposition are disclosed herein. In various aspects, layer deposition can be accomplished in certain ways as follows.

In accordance with the disclosure, methods of constructing a part using metallic glass alloys, layer by layer (i.e. printing or layer deposition) are provided. In certain aspects, a layer of metallic glass-forming alloy (such as a powder, wire or sheet) or metallic glass material is deposited to selected positions and then fused to a layer below by suitable methods such as laser heating or electron beam heating. Specific regions can be heated by techniques such as selective laser melting (SLM). The deposition and fusing are then repeated as need to construct the part, layer by layer. In certain aspects, methods and final parts are improved by providing metallic glass-forming powders or sheets of metallic glass material and optional materials that are not metallic glass with desired properties.

The metallic glass-forming alloy and metallic glass materials may include a metallic glass alloy, a mixture of the alloy's constituent elements, or precursors of metallic glass alloys, as described in further detail herein.

In certain embodiments, a homogenous atomized metallic glass-forming powder is provided. In certain aspects, such powders may provide improved glass-forming ability and repeatability of quality of final parts. Metallic glass-forming (i.e. amorphous) alloys are sensitive to compositional variations, with changes as little as 0.1 wt % affecting the glass-forming ability (GFA) of an alloy. For instance, metallic glass-forming alloys are generally composed of at least three, four, or more different elements, which sometimes have very different densities, creating potential issues with solubility and compositional homogeneity.

To address these potential issues, in certain aspects, the metallic glass-forming powder is a homogenous atomized powder. For instance, a metallic glass forming alloy may be gas atomized during cooling to form an atomized powder, and the atomized powder may be mixed in any suitable manner known in the art, e.g., mechanical mixing, to provide a homogenous atomized metallic glass-forming powder. In certain aspects, homogenous atomized metallic glass-forming powders are useful in the methods described herein to provide repeatability of quality of final parts, as compared to final parts prepared using metallic glass-forming powder with homogeneous properties formed from sectioning and re-melting alloy ingots.

FIG. 1 depicts an exemplary method of constructing a metallic glass part using a platen, and outlet that deposits metallic glass powder on the platen, and a heat source. In other embodiments, the platen can be stationary. According to an embodiment as shown in FIG. 1, a metallic glass-forming powder 100 can be deposited to selected positions on a platen 102 and heated (e.g., within 0.1 second, 0.5 second, 1 second or 5 seconds from the time the powder contacts a layer below) by a suitable heater 104 (e.g. a laser or electron beam) so as to fuse the powder to a layer below. Alternative heating methods can include induction and infrared heating. The powder is heated to a temperature above its melting temperature. The platen 102 can be cooled, for example, by cooling lines 106, through which a cooling fluid such as water or a gas can be flowed. Alternatively, the platen can be cooled by thermoelectric cooling methods. The platen 102 can reduce the thermal exposure of particles previously layered, thereby reducing the likelihood that such particles can be converted to crystalline form during formation of additional layers. The resulting metallic glass-forming powder can be fused to form fused metallic glass 108. As will be understood by those of skill in the art, the initial and final layers of material may or may not be processed in the same manner.

Numerous variations of the device are possible. For example, as will be understood by those of skill in the art, the initial and final layers of material may or may not be processed in the same manner. Further, a wire or sheet may be used instead of a powder. The platen may move or be stationary, or components dispensing the metallic glass can move or be stationary. Alternatively, the platen surface can be covered with the metallic glass-forming alloy, and the alloy can be heated (e.g. by a laser or electron beam) at the positions at which a metallic glass is to be created.

In various embodiments, the platen can be temperature regulated. In some embodiments, the platen as described in various embodiments herein can be cooled, for example, by cooling lines, through which a cooling fluid such as water or a gas can be flowed. Alternatively, the platen can be cooled by thermoelectric cooling methods. In other embodiments, the platen can be a passive heat sink. Alternatively, the platen can be heated. Without wishing to be limited to any mechanism or mode of action, the platen can be heated to reduce or avoid increase of internal stress within the metallic glass on formation.

The metallic glass-forming powder can be deposited from any suitable outlet, such as a nozzle. In one embodiment, the powder can be deposited from a plurality of outlets, movement of each of which can be independently or collectively controlled. The heater can be any suitable heater such as a laser, electron beam, ultrasonic sound wave, infrared light, etc. The powder can be deposited onto the selected positions by moving the outlet, moving the platen or both so that the outlet is positioned at the selected positions relative to the platen. Flow of the powder from the outlet can be controlled by a shutter or valve. The movement of the outlet and/or platen, and the shutter or valve can be controlled by a computer. A part of a desired shape can be constructed by depositing and fusing the powder layer by layer. According to an embodiment, the fused powder can be smoothed by a suitable method, such as polishing and grinding, before the next layer of powder is deposited thereon.

In accordance with certain embodiments, composite parts may be formed by depositing one or more layers of materials that are not metallic glass. For instance, one or more layers of material that is not a metallic glass (e.g., non-heated metallic glass-forming powder, non-amorphous materials, crystalline material, Kevlar fibers, plastic, ceramic or other insulators, other metals or semi-conductors) can be similarly deposited and fused on to a layer of amorphous metal below. In various configurations, the powder can be dispensed with two or more nozzles. In further configuration and alternative to layering, a nozzle can dispense individual granules of crystalline material to create a matrix composite.

Figure 2:
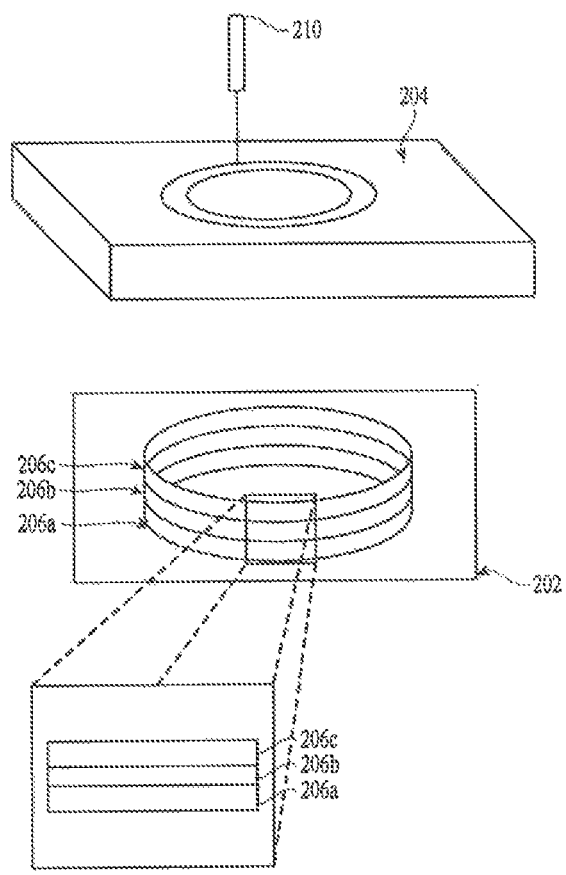
FIG. 2 depicts an exemplary method of constructing a part from metallic glass sheets layer by layer.

FIG. 2 shows an exemplary part made from metallic glass and non-metallic glass-forming powder or sheets layer by layer. Metallic glass feedstock 204 is cut using laser cutting tool 210. This cutting is repeated for each layer 206a, 206b, and 206c. Stacked layers 206a, 206b, and 206c can be fused by applying heat and/or pressure using any suitable method such as hot pressing, laser irradiation, electron beam irradiation, or induction heating while the stacked layers 206a and 206b are on platen 202. Though three layers are depicted in FIG. 2, any number of layers can be fused using the described method. Although FIG. 2 depicts the layers are having distinct boundaries at an interface between adjacent layers, such does not have to be the case. In some embodiments, if the layers may be fused at the interface between each adjacent layer. In other embodiments, if there may be some diffusion between the layers at an interface between adjacent layers.

Figure 3:
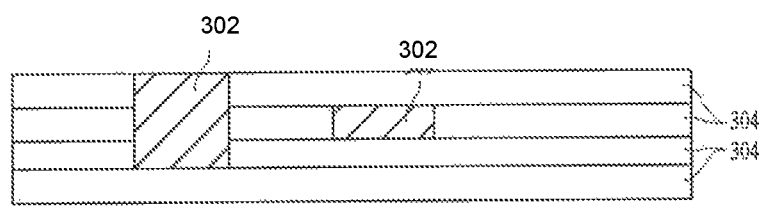
FIG. 3 depicts an exemplary composite part made from metallic glass and non-metallic glass-forming alloy layer by layer.

In an alternative embodiment as shown in FIG. 3, a plurality of layers of metallic glass material can be cut by a suitable method such as laser or die cutting, from one or more layers of metallic glass material 304 formed from the metallic glass-forming powder described herein. The layers of metallic glass correspond to cross-sections of a part to be made. Alternatively, thin sheets can be extruded directly from a melt or created by melt spinning instead of using a powder. The plurality of layers of metallic glass and optionally one or more non-metallic glass layers 302 (e.g., non-heated metallic glass-forming powder, non-amorphous materials, crystalline material, Kevlar fibers, plastic, ceramic or other insulators, other metals or semi-conductors) can then be stacked in desired spatial relations among the layers onto a platen and fused to form the part. In some embodiments, a non-metallic glass material that is in a granulated form can be added selectively added to the layers of metallic glass to form a matrix with of non-metallic glass interspersed between regions of metallic glass.

Without intending to be limited by theory, metallic glass materials may be sensitive to oxygen content. For instance, oxides within an alloy may promote nucleation of crystals, thereby detracting from formation of an amorphous microstructure. Some amorphous alloy compositions form persistent oxide layers, which may interfere with the fusion of particles. Further, surface oxides may also be incorporated into the bulk alloy and may degrade the glass-forming ability of the alloy.

Figure 4A:
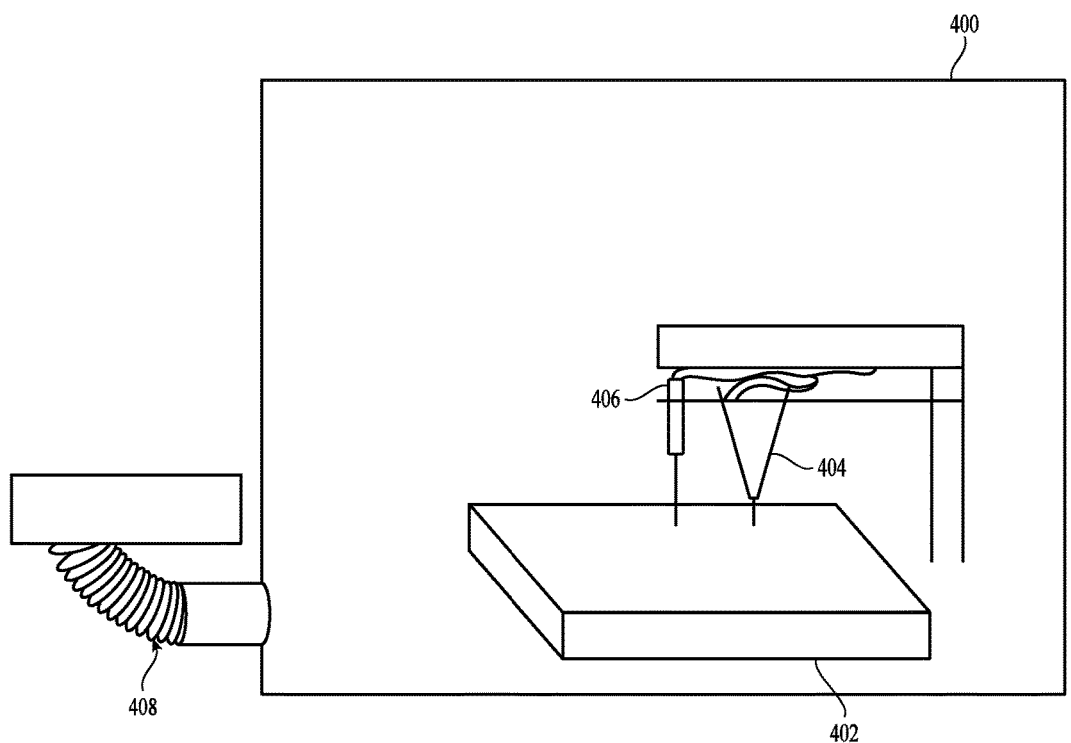
FIG. 4A depicts an exemplary enclosure for providing a vacuum, inert or reducing atmosphere.
Figure 4B:
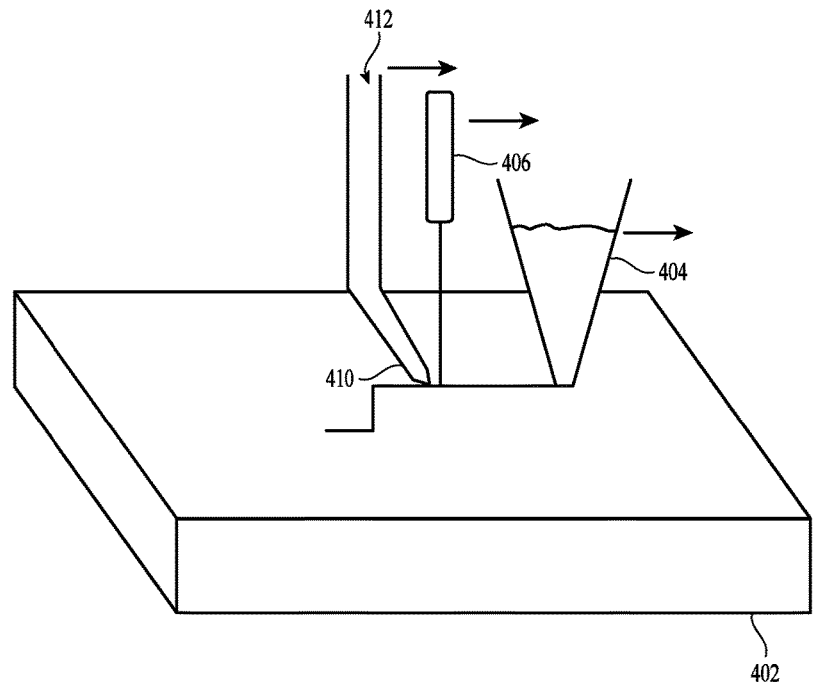
FIG. 4B depicts an exemplary scheme to locally provide an inert or reducing atmosphere.

As such, in certain embodiments, it may be desirable to protect the as-deposited powder (or wires/sheets of metallic glass material, not shown) in an inert atmosphere, a reducing atmosphere, or in vacuum while the powder is being heated, to remove oxygen from particle interfaces and from the final part. As shown in FIG. 4A, the platen 403, the outlet 404 and the heater 406 can be in an enclosure 400 placed under a vacuum (e.g., 1-10 mTorr) by evacuation pump 408, a reducing atmosphere (e.g., hydrogen or a mixture of hydrogen and nitrogen), or an inert atmosphere (e.g., argon, nitrogen, or other inert gases). The enclosure can be pumped by an evacuation pump. Alternatively, as shown in FIG. 4B, in a non-enclosed system inert gas can be locally flowed to the alloy through outlet 410 (or alternatively sheets of metallic glass material, not shown) being heated by the heater.

The selective heating methods described herein can be used to form specific metallic glass structures. These structures can have mechanical properties, including increased hardness, over conventional materials known in the art.

Figure 5A:
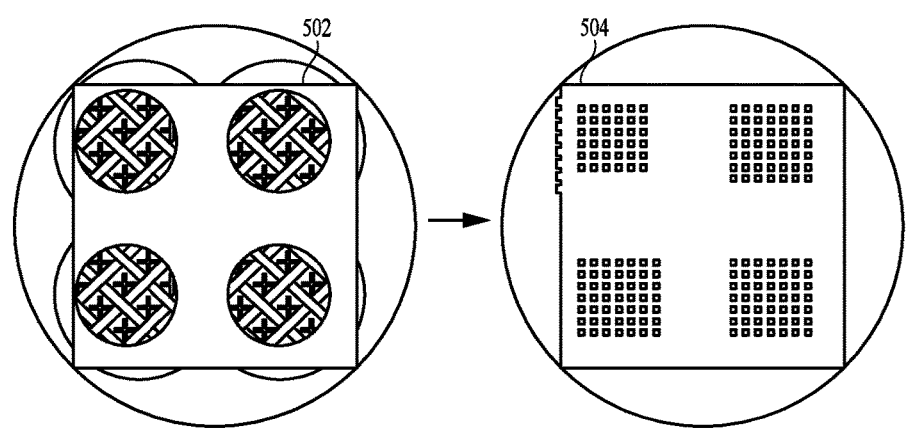
FIG. 5A depicts the substitution of a metal mesh by a metallic glass mesh.

FIG. 5A depicts the substitution of a conventional metal mesh 502 by a metallic glass mesh 504 formed of a single metallic glass material. Metallic glass mesh 504 can be constructed out of a single unitary piece without requiring any overlay of multiple different materials. Many conventional meshes are constructed of two layer stacks. Steel mesh can be used for cosmetic appeal and strength, while smaller pore polymer mesh can be used for particle and liquid ingress. A single layer metallic glass mesh 504 provides greater control of deposition, along with material selection.

In various aspects, metallic glass meshes have properties that require less additional machining than conventional alloys. For example, amorphous metals have higher yield strengths than the corresponding crystalline metals without the need for some conventional metal processing steps such as cold-working and/or work hardening processes (e.g. rolling). This can allow the shape to be better controlled for cosmetic benefits or functional benefits such as more precise control of the mesh opening size.

Figure 5B:
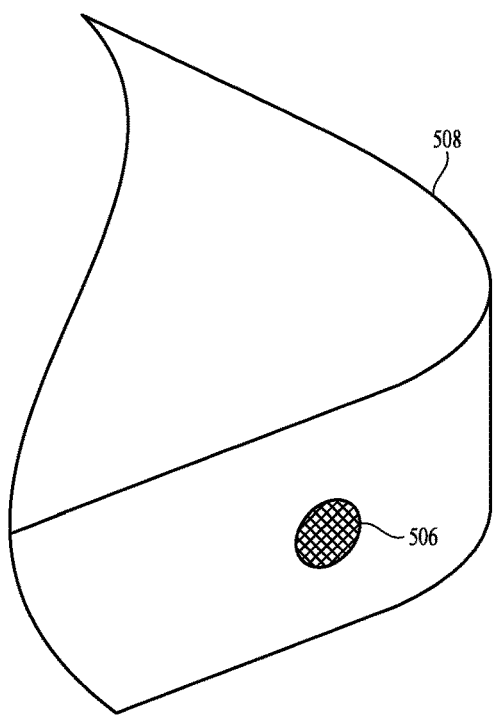
FIG. 5B depicts the metallic glass mesh formed as a unitary component of a housing.
Figure 5C:
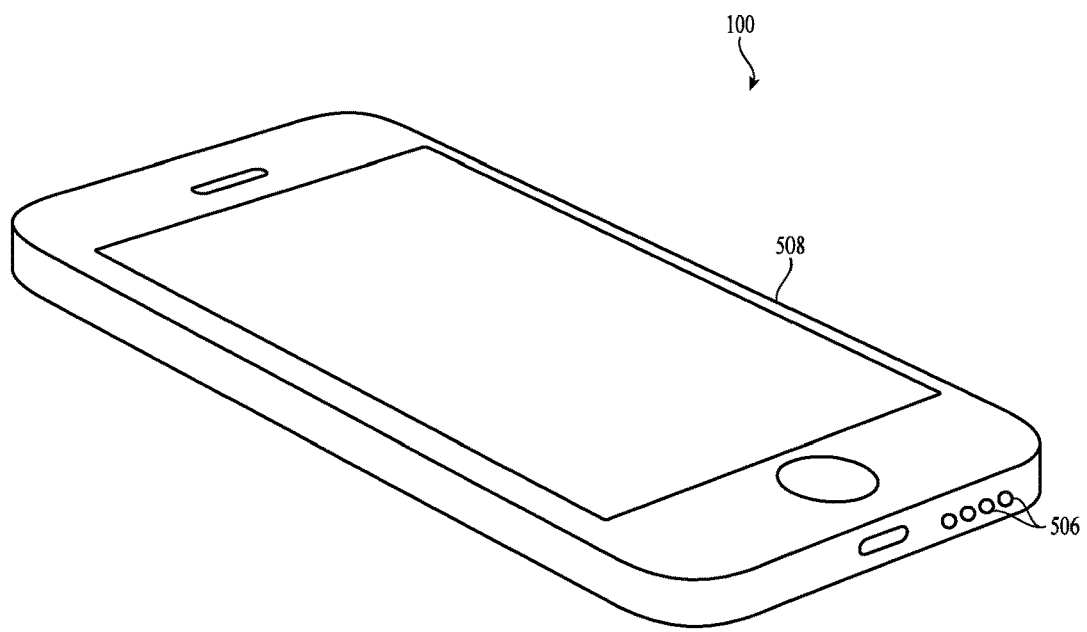
FIG. 5C depicts a metallic glass mesh formed within the housing a device.

In one aspect, a layer of a metallic glass-forming alloy is deposited to form a lattice pattern. In some embodiments, the structure of the lattice can be an organized or ordered pattern. For example, without intending to be limiting, the openings are sized and arranged in an ordered manner that is repeatable. In other embodiments, the structure of the lattice can be random and/or lack order. In some embodiments, the metallic glass-forming alloy can be deposited on portions of a housing to integrally form the metallic glass mesh in the housing FIG. 5B depicts metallic glass mesh 506 formed as a unitary component of a housing 508. For example, the selective heating methods such as SLM described herein allow for metallic glass mesh 506 to be manufactured directly into housing 508 to be an integral component. FIG. 5C further depicts metallic glass mesh 506 within housing 508 of a full device.

In various embodiments, the mesh can have high mechanical strength. Forming a mesh as part of a unitary housing allows design flexibility, such as the capability of hiding acoustic openings with blending, or allowing acoustic mesh to be flush with a surface. It also can reduce the assembly burden because no alignment between parts is required, and the assembly process has fewer steps. The method can result in a higher strength mesh. The mesh opening can be designed to reduce particle/debris ingress and retention.

In further embodiments, the mesh geometry can be prepared to make a hydrophobic metallic glass mesh that reduces the ability of water to pass through. This can be coupled to controlling the ability of particles generally to pass through.

In some embodiments, the metallic glass mesh may be a closed mesh having a relatively high specific and/or absolute acoustic resistance. Such a closed metallic glass mesh material may, for example, be printed to have substantially no calculable openings in the lattice pattern. In other embodiments, the average diameter of mesh openings may be less than 1000 µm. In other embodiments, the average diameter of mesh openings may be less than 500 µm. In still other embodiments the average diameter of mesh openings may be less than 100 µm. In still other embodiments the average diameter of mesh openings may be less than 10 µm. In other embodiments, for example, the acoustic mesh may have a specific acoustic resistance of at least 350 MKS rayls, alternatively at least 1000 MKS rayls, or alternatively at least 1800 MKS rayls.

In various embodiments, the mesh openings have a circular, elliptical, triangular, square, rectangular, rhomboid, pentagonal, hexagonal, or octagonal shape.

The metallic glass mesh can be combined into a part in a variety of ways. In some embodiments, the metallic glass mesh can be printed in situ. In other embodiments, the metallic glass mesh can be flush with housing exterior surface. In further embodiments, the metallic glass mesh can be cosmetically hidden or obscured by another portion. In still further embodiments, the pore shapes can be designed to reduce particle ingress or sticking.

In another aspect, the disclosure is directed to magnetostrictive or piezoelectric actuators that change volume under the influence of an applied magnetic or electric field. By printing the actuator from a metallic glass, voids and/or regions of non-metallic material can be added to a part to create controlled displacement and deflection under applied magnetic or electric fields. Such parts can be prepared, for example, by designing a laser heating or electron beam heating (e.g., SLM) method in which less metallic glass powder is added during SLM. In some embodiments, the void structure can be created from an alloy powder that has not be fully compacted. In another embodiment, crystalline powder can be deposited in the intended void areas, and the crystalline powder can then be removed from the part by chemical or electro-chemical methods to create voids in the part. In a further embodiment, which elemental or pre-alloyed powders are being applied, the ratio of elements can be varied during deposition amorphous regions and crystalline regions of the part can be created by taking advantage of the sensitivity of BMGs to small changes to alloy composition.

Figure 6A:
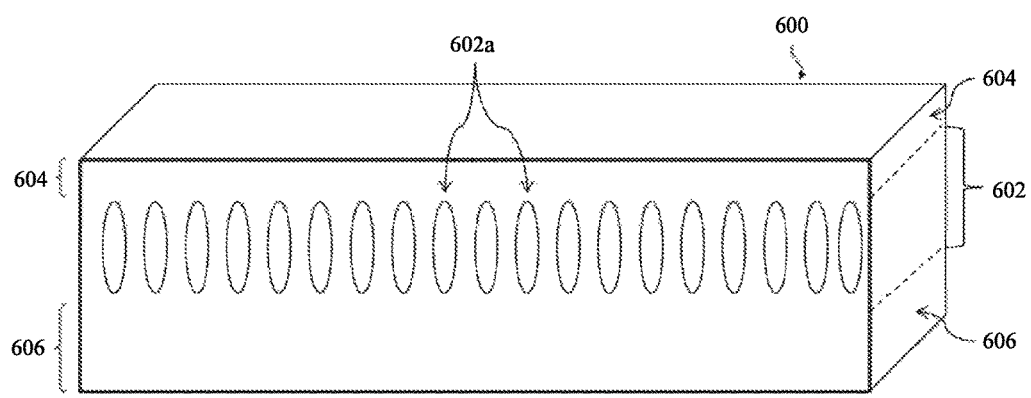
FIG. 6A depicts a cross-sectional view of a part containing a first, second and third portion, where the first and third portions are a metallic glass.

FIG. 6A depicts metal glass actuator 600 containing a second, third, and first portions, 602, 604 and 606. The first portion 606 comprises a metallic glass. The third portion 604 comprises the same metallic glass as the first portion 606. However, the third (i.e. top as depicted in FIG. 6A) portion 604 has less volume than the first (i.e. bottom) portion 606. The second portion 602 is disposed between the first and third portions 606, 604. The second portion comprises a material different from the first and third portions. For example, in some embodiments, the second portion may comprise a crystalline material. In some embodiments, the second portion 602 can comprise a void structure (i.e. a series of voids 602a). The voids can be any size or shape. In some embodiments, the shape and size of the voids in portion 602 can be uniform. In other embodiments, the shape and size of the voids can be different.

Figure 6B:
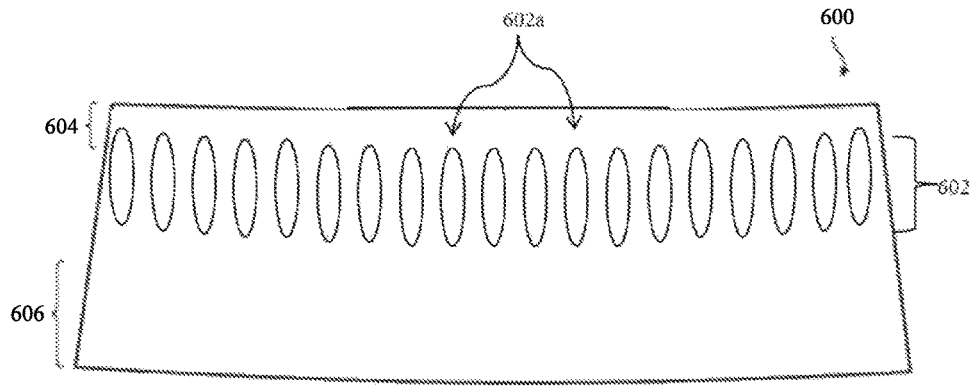
FIG. 6B depicts the part upon application of an electric or magnetic field.

Metallic glass actuator 600 can be magnetostrictive or piezoelectric. The metallic glass actuator 600 bends upon application of a magnetic or electric field, as depicted in FIG. 6B. When the magnetic or electric field is applied, top third portion 604, which has less material volume than bottom first portion 606, expands less. First portion 606, which has more material than third portion 604, expands more. The result is differential expansion of the actuator, and a curvature of the actuator.

The piezoelectric or magnetostrictive actuator can be constructed by printing methods using laser heating or electron beam heating (e.g. SLM). In some embodiments, voids can be formed from powder that has not been fully compacted. In some embodiments, voids can be formed by un-melted or partially-melted powder. In various aspects, in the partially-melted state, the individual powder particles can be partially connected to form a mechanical structure with contacts between particle structures, but are not fully melted to form a solid. In some embodiments, the voids may compromise at least 50% by volume the metallic glass actuator. In some embodiments, the voids may compromise at least 40% by volume the metallic glass actuator. In some embodiments, the voids may compromise at least 30% by volume the metallic glass actuator. In some embodiments, the voids may compromise at least 25% by volume the metallic glass actuator. In some embodiments, the voids may compromise at least 20% by volume the metallic glass actuator. In some embodiments, the voids may compromise at least 10% by volume the metallic glass actuator. In some embodiments, the voids may compromise at least 5% by volume the metallic glass actuator.

In another embodiment, the actuator can bend in response to a temperature/heat gradient. The first and third portions can comprise a metallic glass with a first thermal expansion coefficient. The second portion 602 can comprise a different material or voids that have a second thermal expansion coefficient that is different of the first thermal expansion coefficient. As the actuator is subjected to a temperature gradient, the first and third portions can expand at a different rate than the second portion. This differential in expansions of the portion, can also result in a curvature of the actuator.

The actuators can be used in a variety of applications. In one variation, the actuator can be used as a speaker or vibe module. Alternatively, the actuator can be used as a sensor that generates an electric or magnetic field in response to deflection.

In another aspect, the disclosure is directed to a metallic glass thermal history sensor. The sensor can include multiple lateral beams built one upon the other or optionally separated by spacers (e.g. lugs). Each beam can be printed with differing thermal exposure. The beams can be formed by selecting a metallic glass-forming alloy having a crystallization temperature (Tx) in the desired temperature range of tested amorphous alloys. In various embodiments, thermal exposure can be varied during construction of the thermal history sensor such as by altering the scan speed, power of laser, number of passes, and/or line spacing. In another embodiment, the crystallization temperature of each beam can be varied by slightly varying the alloy composition in each beam. This can be achieved in systems where elemental pre-alloy powders are deposited by separate nozzles.

Figure 7A:
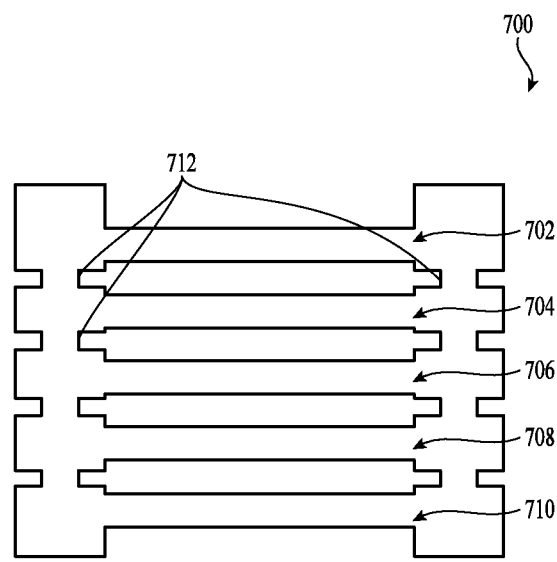
FIG. 7A depicts a part used for a thermal history sensor.

The embodiment of FIG. 7A depicts a thermal history sensor 700. The part includes regions, or beams 702, 704, 706, 708, and 710, having diminishing stiffness. The series of horizontal beams are separated by a series of support lugs 712, which are optional. In other embodiments, the beams 702, 704, 706, 708, and 708 can be built one upon such that adjacent beams are in contact with each other (e.g. 702 is in contact with 704, which is in contact with 706, and so on).

The adjacent beams have lower stress interaction when loading conditions change. In the example of FIG. 7A, top beam 702 has the most thermal exposure during printing due to one or more of the slowest laser scan speed, highest laser power, increased number of passes, and lower line spacing. The lowest beam 710 has the least thermal pressure during printing.

Figure 7B:
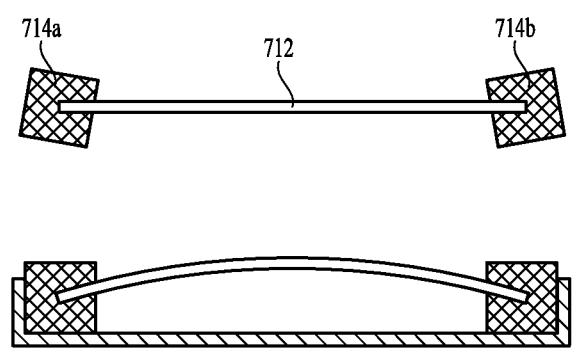
FIG. 7B depicts a support slotted into a lug nut.

FIG. 7B shows beam 712 attached to two support lug nuts 714a and 714b. Support lug nuts 714a and 714b can be positioned such that beam 712 is in a bent position under a fixed load. Alternatively, the load can be placed on beam 712. The mechanical properties of a given beam can thereby be measured. Returning to FIG. 7A, it is contemplated that one or more beams 702-710 can be tested in this manner.

Mechanical properties of the alloy (e.g. toughness) in the crystalline state are generally poorer than in the amorphous state. The stress state can be altered to allow beams to survive when amorphous, but break when crystalline (e.g. designed deflection on beams, make use of notches to trigger failure). Beams with greater thermal exposure history require less future additional temperature time exposure to become crystalline.

Thermal history sensor 700 can be calibrated to different time/temperature exposure severities to determine whether a specific metallic glass material can be used for a specific purpose. For electronic devices, high temperature field exposure scenarios can cause damage (e.g. stress relaxation in materials or unwanted chemical reactions.) The sensor can be used to understand devices thermal exposure history after the device is used.

Returning to the heating and cooling methods of FIGS. 1-4, in various embodiments, platens can be cooled by any suitable method such as flowing liquid or gas therethrough, e.g., water cooling, gas cooling, or thermal electric cooling. The platen can be cooled at a sufficiently high rate to ensure that the fused powder is maintained as fully amorphous (or its desired amorphous state). As discussed herein, amorphous metals can be crystallized by high temperature/time exposures. In this regard, a layer may have an amorphous microstructure when first melted, following deposition and heating according to a method described herein. However, without controlled cooling, previous layers of amorphous metal may be transformed to a crystalline microstructure during deposition and heating of subsequent layers due to heat conduction.

In embodiments herein, the existence of a supercooled liquid region in which the bulk metallic glass can exist as a high-viscous liquid allows for superplastic forming. Large plastic deformations can be obtained. The ability to undergo large plastic deformation in the supercooled liquid region is used for the forming and/or cutting process. As opposed to solids, the liquid bulk solidifying alloy deforms locally, which drastically lowers the required energy for cutting and forming. The ease of cutting and forming depends on the temperature of the alloy, the mold, and the cutting tool. As temperature becomes higher, viscosity becomes lower, and consequently cutting and forming are easier.

Embodiments herein can utilize a thermoplastic forming process with amorphous alloys carried out between Tg and Tx, for example. Herein, Tx and Tg are determined from standard DSC measurements at typical heating rates (e.g. 20° C./min) as the onset of crystallization temperature and the onset of glass transition temperature.

The parameters used in the printing methods described herein can depend on the metallic glass-forming alloy. The amorphous alloy components (powder, wire, or sheets) can be at or below the critical casting thickness and the final part can have thickness that is thicker than the critical casting thickness. This technique can similarly be used to produce bulk parts using amorphous alloys that would not traditionally be considered as bulk glass-formers, since fully amorphous powder can be made with very small particle sizes. Moreover, the time and temperature of the heating and shaping operation is selected such that the elastic strain limit of the amorphous alloy could be substantially preserved to be not less than 1.0%, and preferably not being less than 1.5%. In the context of the embodiments herein, temperatures around glass transition mean the forming temperatures can be below glass transition temperature, at or around glass transition temperature, and above glass transition temperature, but preferably at temperatures below the crystallization temperature Tx. The cooling step is carried out at rates similar to the heating rates at the heating step, and preferably at rates greater than the heating rates at the heating step. The cooling step is also achieved preferably while the forming and shaping loads are still maintained.

Figure 8:
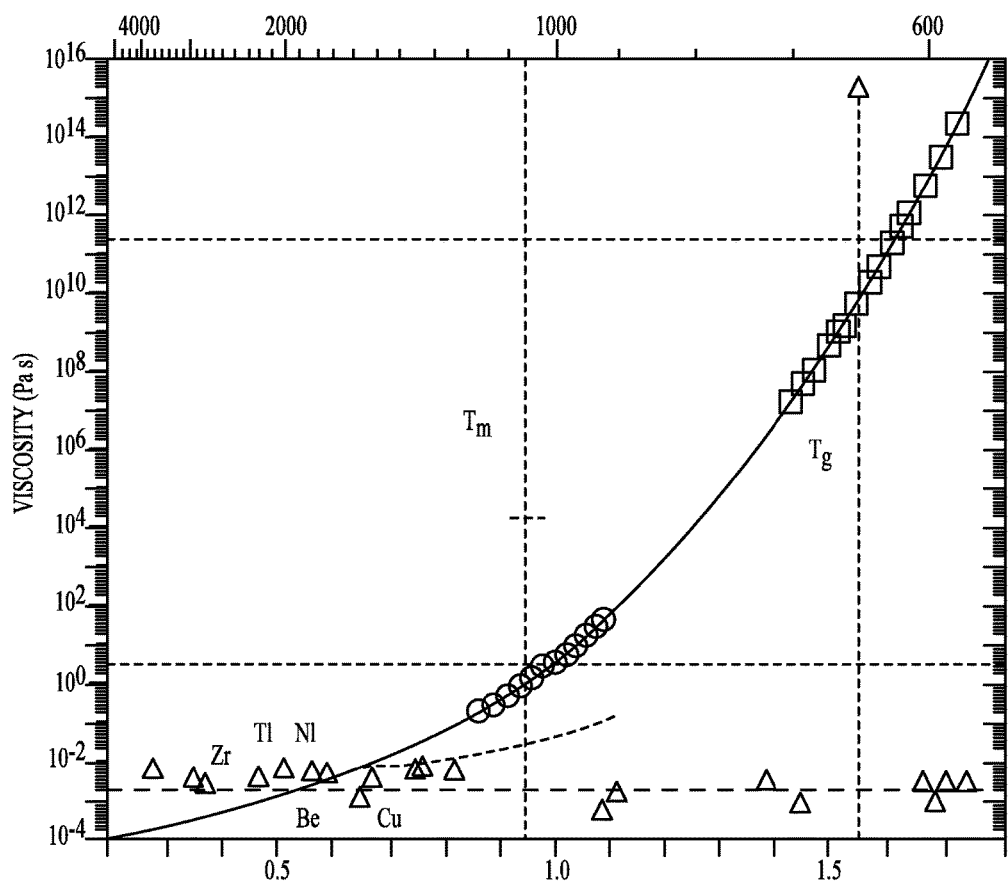
FIG. 8 depicts a temperature-viscosity diagram of an exemplary bulk solidifying amorphous alloy.

FIG. 8 shows a viscosity-temperature graph of an exemplary bulk solidifying amorphous alloy, from an exemplary series of Zr—Ti—Ni—Cu—Be alloys manufactured by Liquidmetal Technology. It should be noted that there is no clear liquid/solid transformation for a bulk solidifying amorphous metal during the formation of an amorphous solid. The molten alloy becomes more and more viscous with increasing undercooling until it approaches solid form around the glass transition temperature. Accordingly, the temperature of solidification front for bulk solidifying amorphous alloys can be around glass transition temperature, where the alloy will practically act as a solid for the purposes of pulling out the quenched amorphous sheet product.

Figure 9:
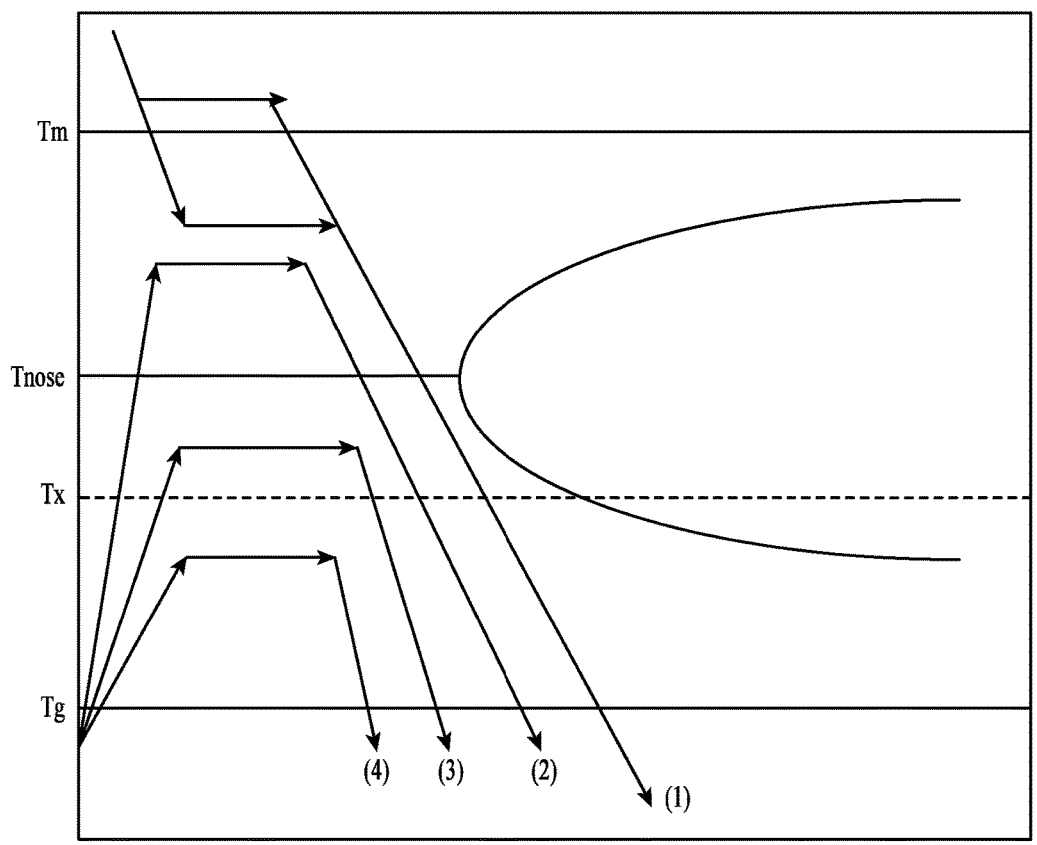
FIG. 9 depicts a schematic of a time-temperature-transformation (TTT) diagram for an exemplary bulk solidifying amorphous alloy.

FIG. 9 shows the time-temperature-transformation (TTT) cooling curve of an exemplary bulk solidifying amorphous alloy, or TTT diagram. Bulk-solidifying amorphous metals do not experience a liquid/solid crystallization transformation upon cooling, as with conventional metals. Instead, the highly fluid, non-crystalline form of the metal found at high temperatures (near a "melting temperature" Tm) becomes more viscous as the temperature is reduced (near to the glass transition temperature Tg), eventually taking on the outward physical properties of a conventional solid.

Even though there is no liquid/crystallization transformation for a bulk solidifying amorphous metal, a melting temperature Tm may be defined as the thermodynamic liquidus temperature of the corresponding crystalline phase. FIG. 9 shows processing methods of die casting from at or above Tm to below Tg without example time-temperature trajectory (1) hitting the TTT curve. Time-temperature trajectories (2), (3), and (4) depict processes at or below Tg being heated to temperatures below Tm. Under this regime, the viscosity of bulk-solidifying amorphous alloys at or above the melting temperature Tm could lie in the range of about 0.1 poise to about 10,000 poise, and even sometimes under 0.01 poise. A lower viscosity at the "melting temperature" would provide faster and complete filling of intricate portions of the shell/mold with a bulk solidifying amorphous metal for forming the metallic glass parts. Furthermore, the cooling rate of the molten metal to form a metallic glass part has to be such that the time-temperature profile during cooling does not traverse through the nose-shaped region bounding the crystallized region in the TTT diagram of FIG. 9. In FIG. 9, Tnose (at the peak of crystallization region) is the critical crystallization temperature Tx where crystallization is most rapid and occurs in the shortest time scale.

The supercooled liquid region, the temperature region between Tg and Tx, is a manifestation of the stability against crystallization of bulk solidification alloys. In this temperature region the bulk-solidifying alloy can exist as a high viscous liquid. The viscosity of the bulk solidifying alloy in the supercooled liquid region can vary between $10^{12}$ Pa s at the glass transition temperature down to $10^5$ Pa s at the crystallization temperature, the high temperature limit of the supercooled liquid region. Liquids with such viscosities can undergo substantial plastic strain under an applied pressure. The embodiments herein make use of the large plastic formability in the supercooled liquid region as a forming and separating method.

Technically, the nose-shaped curve shown in the TTT diagram describes Tx as a function of temperature and time. Thus, regardless of the trajectory that one takes while heating or cooling a metal alloy, when one hits the TTT curve, one has reached Tx. In FIG. 9, Tx is shown as a dashed line as Tx can vary from close to Tm to close to Tg.

The schematic TTT diagram of FIG. 9 shows processing methods of die casting from at or above Tm to below Tg without the time-temperature trajectory (shown as (1) as an example trajectory) hitting the TTT curve. During die casting, the forming takes place substantially simultaneously with fast cooling to avoid the trajectory hitting the TTT curve. The processing methods for superplastic forming (SPF) range from at or below Tg to below Tm without the time-temperature trajectory (shown as (2), (3) and (4) as example trajectories) hitting the TTT curve. In SPF, the metallic glass is reheated into the supercooled liquid region where the available processing window could be much larger than die casting, resulting in better controllability of the process. The SPF process does not require fast cooling to avoid crystallization during cooling. Also, as shown by example trajectories (2), (3) and (4), the SPF can be carried out with the highest temperature during SPF being above Tnose or below Tnose, up to about Tm. If one heats up a piece of amorphous alloy but manages to avoid hitting the TTT curve, you have heated "between Tg and Tm", but one would have not reached Tx.

Typical differential scanning calorimeter (DSC) heating curves of bulk-solidifying amorphous alloys taken at a heating rate of 20 C/min describe, for the most part, a particular trajectory across the TTT data where one would likely see a Tg at a certain temperature, a Tx when the DSC heating ramp crosses the TTT crystallization onset, and eventually melting peaks when the same trajectory crosses the temperature range for melting. If one heats a bulk-solidifying amorphous alloy at a rapid heating rate as shown by the ramp up portion of trajectories (2), (3) and (4) in FIG. 9, then one could avoid the TTT curve entirely, and the DSC data would show a glass transition but no Tx upon heating. Another way to think about it is trajectories (2), (3) and (4) can fall anywhere in temperature between the nose of the TTT curve (and even above it) and the Tg line, as long as it does not hit the crystallization curve. That just means that the horizontal plateau in trajectories might get much shorter as one increases the processing temperature.

Any metallic glass-forming alloy in the art may be used in the methods described herein. As used herein, the terms metallic glass, amorphous metal, and amorphous alloy are used interchangeably.

An amorphous or non-crystalline material is a material that lacks lattice periodicity, which is characteristic of a crystal. As used herein, an amorphous material includes glass which is an amorphous solid that softens and transforms into a liquid-like state upon heating through a glass transition. Generally, amorphous materials lack the long-range order characteristic of a crystal, though they can possess some short-range order at the atomic length scale due to the nature of chemical bonding. The distinction between amorphous solids and crystalline solids can be made based on lattice periodicity as determined by structural characterization techniques such as x-ray diffraction and transmission electron microscopy.

In one embodiment, an amorphous alloy composition can be homogeneous with respect to the amorphous phase. A substance that is uniform in composition is homogeneous. This is in contrast to a substance that is heterogeneous. A substance is homogeneous when a volume of the substance is divided in half and both halves have substantially the same composition. For example, a particulate suspension is homogeneous when a volume of the particulate suspension is divided in half and both halves have substantially the same volume of particles. However, it might be possible to see the individual particles under a microscope. Another example of a homogeneous substance is air, where different ingredients therein are equally suspended, though the particles, gases and liquids in air can be analyzed separately or separated from air. In various embodiments, the particle composition can vary, provided that the final amorphous material has the elemental composition of the amorphous alloy.

The methods described herein can be applicable to any type of suitable amorphous alloy. Similarly, the amorphous alloy described herein as a constituent of a composition or article can be of any type. As recognized by those of skill in the art, amorphous alloys may be selected based on a variety of potentially useful properties. In particular, amorphous alloys tend to be stronger than crystalline alloys of similar chemical composition.

The alloy can comprise multiple transition metal elements, such as at least two, at least three, at least four, or more, transitional metal elements. The alloy can also optionally comprise one or more nonmetal elements, such as one, at least two, at least three, at least four, or more, nonmetal elements. A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a metallic glass containing a transition metal element can have at least one of Sc, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used.

Depending on the application, any suitable nonmetal elements, or their combinations, can be used. A nonmetal element can be any element that is found in Groups 13-17 in the Periodic Table. For example, a nonmetal element can be any one of F, Cl, Br, I, At, O, S, Se, Te, Po, N, P, As, Sb, Bi, C, Si, Ge, Sn, Pb, and B. Occasionally, a nonmetal element can also refer to certain metalloids (e.g., B, Si, Ge, As, Sb, Te, and Po) in Groups 13-17. In one embodiment, the nonmetal elements can include B, Si, C, P, or combinations thereof. Accordingly, for example, the alloy can comprise a boride, a carbide, or both.

In some embodiments, the alloy composition described herein can be fully alloyed. The term fully alloyed used herein can account for minor variations within the error tolerance. For example, it can refer to at least 90% alloyed, such as at least 95% alloyed, such as at least 99% alloyed, such as at least 99.5% alloyed, or such as at least 99.9% alloyed. The percentage herein can refer to either volume percent or weight percentage, depending on the context. These percentages can be balanced by impurities, which can be in terms of composition or phases that are not a part of the alloy. The alloys can be homogeneous or heterogeneous, e.g., in composition, distribution of elements, amorphicity/crystallinity, etc.

The alloy can include any combination of the above elements in its chemical formula or chemical composition. The elements can be present at different weight or volume percentages. Alternatively, in one embodiment, the above-described percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. The alloy can also be free of any of the aforementioned elements to suit a particular purpose. For example, in some embodiments, the alloy, or the composition including the alloy, can be substantially free of nickel, aluminum, titanium, beryllium, or combinations thereof. In one embodiment, the alloy or the composite is completely free of nickel, aluminum, titanium, beryllium, or combinations thereof.

Furthermore, the amorphous alloy can also be one of the exemplary compositions described in U.S. Patent Application Publication Nos. 2010/0300148 or 2013/0309121, the contents of which are herein incorporated by reference.

The amorphous alloys can also be ferrous alloys, such as Fe, Ni, and Co based alloys. Examples of such compositions are disclosed in U.S. Pat. Nos. 6,325,868; 5,288,344; 5,368,659; 5,618,359; and 5,735,975, Inoue et al., Appl. Phys. Lett., Volume 71, p 464 (1997), Shen et al., Mater. Trans., JIM, Volume 42, p 2136 (2001), and Japanese Patent Application No. 200126277 (Pub. No. 2001303218 A). One exemplary composition is $Fe_{72}Al_5Ga_2P_{11}C_6B_4$. Another example is $Fe_{72}Al_7Zr_{10}Mo_5W_2B_{15}$. Another iron-based alloy system that can be used in the coating herein is disclosed in U.S. Patent Application Publication No. 2010/0084052, wherein the amorphous metal contains, for example, manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The afore described amorphous alloy systems can further include additional elements, such as additional transition metal elements, including Nb, Cr, V, and Co. The additional elements can be present at less than or equal to about 30 wt %, such as less than or equal to about 20 wt %, such as less than or equal to about 10 wt %, such as less than or equal to about 5 wt %. In one embodiment, the additional, optional element is at least one of cobalt, manganese, zirconium, tantalum, niobium, tungsten, yttrium, titanium, vanadium and hafnium to form carbides and further improve wear and corrosion resistance. Further optional elements may include phosphorous, germanium and arsenic, totaling up to about 2%, and preferably less than 1%, to reduce melting point. Otherwise incidental impurities should be less than about 2% and preferably 0.5%.

In some embodiments, a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, and such as about 0.1 wt %. In some embodiments, these percentages can be volume percentages instead of weight percentages. In one embodiment, the alloy sample/composition consists essentially of the amorphous alloy (with only a small incidental amount of impurities). In another embodiment, the composition includes the amorphous alloy (with no observable trace of impurities).

In other embodiments, amorphous alloys, for example, of boron, silicon, phosphorus, and other glass-formers with magnetic metals (iron, cobalt, nickel) may be magnetic, with low coercivity and high electrical resistance. The high resistance leads to low losses by eddy currents when subjected to alternating magnetic fields, a property useful, for example, as transformer magnetic cores.

In further embodiments, mixfunctional elements and alloys can be added to the amorphous metal substrate by the methods disclosed herein. Metallic glass composites of materials that were not able to be formed previously can be prepared in this manner. In some variations, metallic glass powder can be embedded with another material powder that imparts specific properties. For example, magnetic alloys and particles can be added to metallic glass powder, such that a non-magnetic metallic glass alloy can be modified to exhibit magnetic properties. Likewise, particles of a ductile material can be added to stop crack tip propagation and improve the toughness of the composite. Heating methods disclosed herein can be used to make such materials by keeping the melted/heat affected zone localized and quiescent (e.g. by reducing mixing of elements between neighboring regions, imparting compositional change). In various aspects, different amounts of heat to each powder type to tune temperature exposure of each, for example by using a CCD to identify each powder type, or by the properties of the powder (e.g. reflectivity under particular wavelengths, heat capacity). In another variation, metallic glass and other material powders can be added separately during each layering step.

The methods herein can be valuable in the fabrication of electronic devices using a metallic glass. An electronic device herein can refer to any electronic device known in the art. For example, it can be a telephone, such as a cell phone, a land-line phone, or any communication device, such as a smart phone, including, for example an iPhone®, or an electronic email sending/receiving device. It can be a part of a display, such as a digital display, a TV monitor, an electronic-book reader, a portable web-browser (e.g., iPad®), watch, or a computer monitor. It can also be an entertainment device, including a portable DVD player, conventional DVD player, Blue-Ray disk player, video game console, music player, such as a portable music player (e.g., iPod®), etc. It can also be a part of a device that provides control, such as controlling the streaming of images, videos, or sounds (e.g., Apple TV®), or it can be a remote control for an electronic device. It can be a part of a computer or its accessories, such as a hard drive tower housing or casing, laptop housing, laptop keyboard, laptop track pad, desktop keyboard, mouse, or speaker. The article can also be applied to a device such as a watch or a clock.

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

All publications, patents, and patent applications cited in this Specification are hereby incorporated by reference in their entirety.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A metallic glass actuator comprising:
    a first portion comprising a metallic glass,
    a second portion comprising a void structure;
    a third portion comprising the metallic glass of the first portion, wherein the third portion has a volume less than the volume of the first portion; and
    where the second portion is disposed between the first and third portions and wherein the metallic glass actuator is of unitary construction.

2. The metallic glass actuator of claim 1 wherein the void structure comprises at least 5% void by volume.

3. The metallic glass actuator of claim 2 wherein the void structure is created by metallic glass powder that is not compacted.

4. The metallic glass actuator of claim 1 wherein the first and third portions are composed of fused metallic glass powder.

5. The metallic glass actuator of claim 1 wherein the first and third portions comprise an electromechanical material which alters its shape under application of an electric field.

6. The metallic glass actuator of claim 1 wherein the first and third portions comprise a magnetostrictive material which alters its shape under application of a magnetic field.

7. The metallic glass actuator of claim 1, wherein at least a portion of the metallic glass of the first portion surrounds the void structure.

* * * * *